(12) United States Patent
Ono et al.

(10) Patent No.: US 10,749,022 B2
(45) Date of Patent: Aug. 18, 2020

(54) SEMICONDUCTOR DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventors: Syotaro Ono, Kanazawa (JP); Hideto Sugawara, Nonoichi (JP); Hiroshi Ohta, Kanazawa (JP); Hisao Ichijo, Kanazawa (JP); Hiroaki Yamashita, Hakusan (JP)

(73) Assignees: KABUSHIKI KAISHA TOSHIBA, Minato-ku (JP); TOSHIBA ELECTRONIC DEVICES & STORAGE CORPORATION, Minato-ku (JP)

(*) Notice: Subject to any disclaimer, the term of this patent is extended or adjusted under 35 U.S.C. 154(b) by 0 days.

(21) Appl. No.: 16/291,415

(22) Filed: Mar. 4, 2019

(65) Prior Publication Data
US 2020/0091335 A1   Mar. 19, 2020

(30) Foreign Application Priority Data

Sep. 14, 2018  (JP) ................... 2018-172371

(51) Int. Cl.
*H01L 29/739* (2006.01)
*H01L 23/535* (2006.01)
(Continued)

(52) U.S. Cl.
CPC ...... *H01L 29/7804* (2013.01); *H01L 29/0865* (2013.01); *H01L 29/0882* (2013.01);
(Continued)

(58) Field of Classification Search
CPC ............ H01L 29/0634; H01L 29/7802; H01L 29/0878
See application file for complete search history.

(56) References Cited

U.S. PATENT DOCUMENTS 6,849,880 B1   2/2005  Saito et al.
8,921,925 B2  12/2014  Nakajima
(Continued)

FOREIGN PATENT DOCUMENTS

JP   2005-085990   3/2005
JP     3634848     3/2005
(Continued)

*Primary Examiner* — Brian Turner
(74) *Attorney, Agent, or Firm* — Oblon, McClelland, Maier & Neustadt, L.L.P.

(57) ABSTRACT

According to one embodiment, a semiconductor device includes first and second electrodes, first, second, third, fourth, fifth, sixth and seventh semiconductor regions, and a gate electrode. The first semiconductor region is provided on the first electrode. The second semiconductor region is provided on a portion of the first semiconductor region. The third semiconductor region is provided on another portion of the first semiconductor region. The fourth semiconductor region is provided in at least a portion between the first and third semiconductor regions. The fifth semiconductor region is provided between the first and fourth semiconductor regions. The sixth semiconductor region is provided on the third semiconductor region. The seventh semiconductor region is provided selectively on the sixth semiconductor region. The gate electrode opposes the second, sixth, and seventh semiconductor regions. The second electrode is provided on the sixth and seventh semiconductor regions.

7 Claims, 11 Drawing Sheets

(51) Int. Cl.
*H01L 27/06* (2006.01)
*H01L 29/36* (2006.01)
*H01L 29/417* (2006.01)
*H01L 29/78* (2006.01)
*H01L 29/08* (2006.01)
*H01L 29/66* (2006.01)
*H01L 29/10* (2006.01)

(52) U.S. Cl.
CPC .... *H01L 29/1095* (2013.01); *H01L 29/41741* (2013.01); *H01L 29/66712* (2013.01)

(56) References Cited

U.S. PATENT DOCUMENTS

| | | | |
|---|---|---|---|
| 9,219,141 | B2 | 12/2015 | Tamura et al. |
| 2002/0185705 | A1* | 12/2002 | Saitoh ................ H01L 21/3247 257/492 |
| 2004/0129973 | A1 | 7/2004 | Saito et al. |
| 2009/0032851 | A1* | 2/2009 | Pfirsch ................ H01L 29/0623 257/288 |
| 2017/0345893 | A1* | 11/2017 | Willmeroth ......... H01L 29/0634 |
| 2019/0040545 | A1* | 2/2019 | Nakamura .......... H01L 29/8613 |

FOREIGN PATENT DOCUMENTS

| | | |
|---|---|---|
| JP | 5748476 | 7/2015 |
| JP | 6221436 | 1/2017 |

\* cited by examiner

SEMICONDUCTOR DEVICE

CROSS-REFERENCE TO RELATED APPLICATIONS

This application is based upon and claims the benefit of priority from Japanese Patent Application No. 2018-172371, filed on Sep. 14, 2018; the entire contents of which are incorporated herein by reference.

FIELD

Embodiments described herein relate generally to a semiconductor device.

BACKGROUND

Semiconductor devices such as MOSFETs (Metal Oxide Semiconductor Field Effect Transistors) and the like are used in applications such as power conversion, etc. It is desirable to reduce the noise generated by the semiconductor devices.

DETAILED DESCRIPTION

According to one embodiment, a semiconductor device includes a first electrode, a first semiconductor region of a first conductivity type, a second semiconductor region of the first conductivity type, a third semiconductor region of a second conductivity type, a fourth semiconductor region of the first conductivity type, a fifth semiconductor region of the first conductivity type, a sixth semiconductor region of the second conductivity type, a seventh semiconductor region of the first conductivity type, a gate electrode, and a second electrode. The first semiconductor region is provided on the first electrode. The first semiconductor region is electrically connected to the first electrode. The second semiconductor region is provided on a portion of the first semiconductor region. An impurity concentration of the first conductivity type in the second semiconductor region is lower than an impurity concentration of the first conductivity type in the first semiconductor region. The third semiconductor region is provided on another portion of the first semiconductor region. The third semiconductor region is arranged with at least a portion of the second semiconductor region in a first direction perpendicular to a second direction. The second direction is from the first electrode toward the first semiconductor region. The fourth semiconductor region is provided in at least a portion between the first semiconductor region and the third semiconductor region. An impurity concentration of the first conductivity type in the fourth semiconductor region is lower than the impurity concentration of the first conductivity type in the first semiconductor region and higher than the impurity concentration of the first conductivity type in the second semiconductor region. The fifth semiconductor region is provided between the first semiconductor region and the fourth semiconductor region. An impurity concentration of the first conductivity type in the fifth semiconductor region is lower than the impurity concentration of the first conductivity type in the fourth semiconductor region. The sixth semiconductor region is provided on the third semiconductor region. An impurity concentration of the second conductivity type in the sixth semiconductor region is higher than an impurity concentration of the second conductivity type in the third semiconductor region. The seventh semiconductor region is provided selectively on the sixth semiconductor region. The gate electrode opposes the second semiconductor region, the sixth semiconductor region, and the seventh semiconductor region with a gate insulating layer interposed. The second electrode is provided on the sixth semiconductor region and the seventh semiconductor region. The second electrode is electrically connected to the sixth semiconductor region and the seventh semiconductor region.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

In the following descriptions and drawings, notations of $n^{++}$, $n^{+}$, $n$, $n^{-}$ and $p^{+}$, $p$, $p^{-}$ represent relative height of an impurity concentration in conductivity types. For example, the notation with "+" shows a relatively higher impurity concentration than an impurity concentration for the notation without any of "+" and "−". The notation with "−" shows a relatively lower impurity concentration than the impurity concentration for the notation without any of them. These notations represent relative height of a net impurity concentration after mutual compensation of these impurities when respective regions include both of a p-type impurity and an n-type impurity.

In each of the embodiments described below, each embodiment may be executed by inverting the p-type and n-type of each semiconductor region.

First Embodiment

Figure 1:
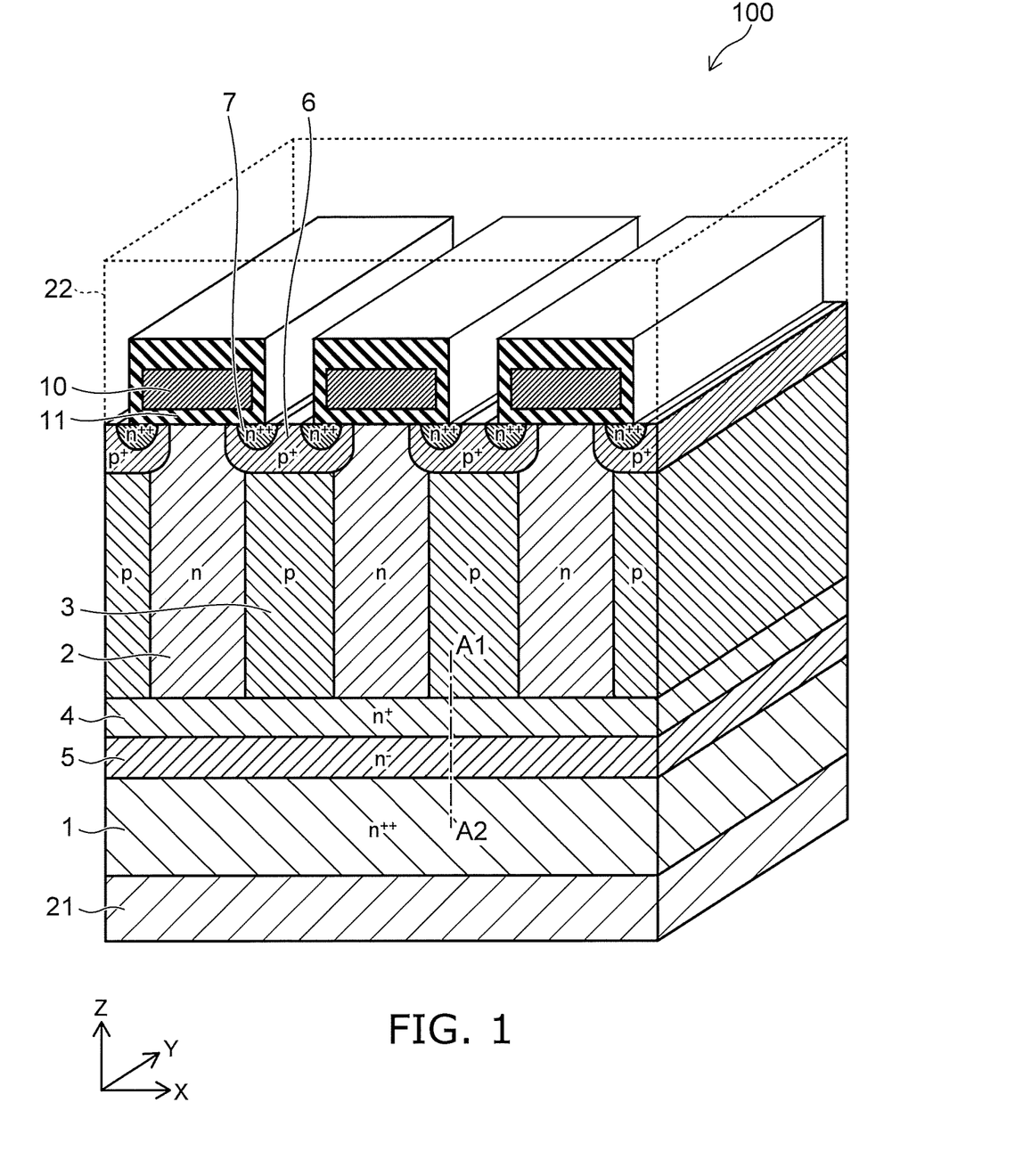
FIG. 1 is a perspective cross-sectional view illustrating a semiconductor device according to a first embodiment.

FIG. 1 is a perspective cross-sectional view illustrating a semiconductor device according to a first embodiment.

The semiconductor device 100 illustrated in FIG. 1 is a MOSFET. The semiconductor device 100 includes an $n^{++}$-type (first conductivity type) drain region 1 (first semiconductor region), an n-type pillar region 2 (second semiconductor region), a p-type (second conductivity type) pillar region 3 (third semiconductor region), an $n^+$-type buffer region 4 (fourth semiconductor region), an $n^-$-type accumulation region 5 (fifth semiconductor region), a $p^+$-type base region 6 (sixth semiconductor region), an $n^{++}$-type source region 7 (seventh semiconductor region), a gate electrode 10, a drain electrode (first electrode), and a source electrode 22 (second electrode). To illustrate the upper surface structure of the semiconductor device 100 in FIG. 1, only the outer edge of the source electrode 22 is illustrated by broken lines.

An XYZ orthogonal coordinate system is used in the description of the embodiments. The direction from the drain electrode 21 toward the $n^{++}$-type drain region 1 is taken as a Z-direction (a second direction). Two mutually-orthogonal directions perpendicular to the Z-direction are taken as an X-direction (a first direction) and a Y-direction. For the description, the direction from the drain electrode 21 toward the $n^{++}$-type drain region 1 is called "up;" and the reverse direction is called "down." These directions are based on the relative positional relationship between the drain electrode 21 and the $n^{++}$-type drain region 1 and are independent of the direction of gravity.

The drain electrode 21 is provided at the lower surface of the semiconductor device 100. The $n^{++}$-type drain region 1 is provided on the drain electrode 21 and is electrically connected to the drain electrode 21. The n-type pillar region 2 is provided on a portion of the $n^{++}$-type drain region 1. The p-type pillar region 3 is provided on another portion of the $n^{++}$-type drain region 1. The p-type pillar region 3 is arranged with the n-type pillar region 2 in the X-direction.

The $n^+$-type buffer region 4 is provided between the $n^{++}$-type drain region 1 and the n-type pillar region 2 and between the $n^{++}$-type drain region 1 and the p-type pillar region 3. The $n^-$-type accumulation region 5 is provided between the $n^{++}$-type drain region 1 and the $n^+$-type buffer region 4.

As illustrated in FIG. 1, the n-type impurity concentration of the $n^+$-type buffer region 4 is lower than the n-type impurity concentration of the $n^{++}$-type drain region 1 and higher than the n-type impurity concentration of the n-type pillar region 2. The n-type impurity concentration of the $n^-$-type accumulation region 5 is lower than the n-type impurity concentration of the $n^+$-type buffer region 4. The n-type impurity concentration of the $n^-$-type accumulation region 5 may be the same as the n-type impurity concentration of the n-type pillar region 2 or may be lower than the n-type impurity concentration of the n-type pillar region 2 as illustrated in FIG. 1.

The $p^+$-type base region 6 is provided on the p-type pillar region 3. The p-type impurity concentration of the $p^+$-type base region 6 is higher than the p-type impurity concentration of the p-type pillar region 3. The $n^{++}$-type source region 7 is provided selectively on the $p^+$-type base region 6. The gate electrode 10 opposes the n-type pillar region 2, the $p^+$-type base region 6, and the $n^{++}$-type source region 7 with a gate insulating layer 11 interposed. The source electrode 22 is provided on the $p^+$-type base region 6 and the $n^{++}$-type source region 7 and is electrically connected to the $p^+$-type base region 6 and the $n^{++}$-type source region 7. An insulating layer is provided between the gate electrode 10 and the source electrode 22; and these electrodes are electrically isolated from each other.

The n-type pillar regions 2, the p-type pillar regions 3, the $p^+$-type base regions 6, the $n^{++}$-type source regions 7, and the gate electrodes 10 are multiply provided in the X-direction and extend in the Y-direction. The n-type pillar regions 2 and the p-type pillar regions 3 are provided alternately in the X-direction. The $n^+$-type buffer region 4 and the $n^-$-type accumulation region 5 are provided between the $n^{++}$-type drain region 1 and the multiple n-type pillar regions 2 and between the $n^{++}$-type drain region 1 and the multiple p-type pillar regions 3. The multiple $p^+$-type base regions 6 are provided respectively on the multiple p-type pillar regions 3. At least one $n^{++}$-type source region 7 is selectively provided on each of the $p^+$-type base regions 6. The multiple gate electrodes 10 are provided respectively on the multiple n-type pillar regions 2.

At least a portion of the n-type pillar region 2 and at least a portion of the p-type pillar region 3 are provided alternately in one direction; the net impurity amounts of each of the n-type and the p-type of the portions provided alternately are designed to be substantially equal; thereby, a super junction structure (hereinbelow, called a SJ structure) is formed in which a high breakdown voltage can be maintained. As long as a SJ structure can be formed, the specific arrangement of the n-type pillar region 2 and the p-type pillar region 3 is modifiable as appropriate. For example, multiple p-type pillar regions 3 that are arranged in the X-direction and the Y-direction may be provided inside the n-type pillar region 2. Or, multiple n-type pillar regions 2 that are arranged in the X-direction and the Y-direction may be provided inside the p-type pillar region 3.

Figure 2:
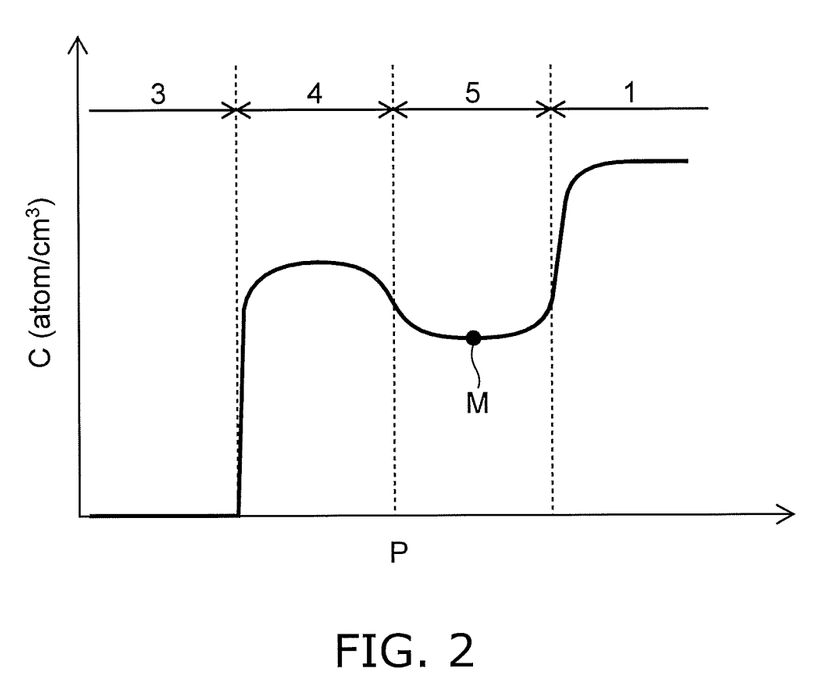
FIG. 2 is a graph showing an impurity profile in A1-A2 line in FIG. 1.

FIG. 2 is a graph showing an impurity profile in A1-A2 line in FIG. 1.

FIG. 2 shows a profile of an n-type impurity concentration in A1-A2 line. The A1-A2 line passes the p-type pillar region 3, the $n^+$-type buffer region 4, the $n^-$-type accumulation region 5, and the $n^{++}$-type drain region 1. The A1-A2 line is aligned with the Z-direction. In FIG. 2, the horizontal axis represents a position P in the Z-direction. The vertical axis represents an n-type impurity concentration C (atoms/cm$^3$). The n-type impurity concentration C shows a value after compensation in FIG. 2. In the case where the n-type pillar region 2, the p-type pillar region 3, the $n^+$-type buffer region 4, and the $n^-$-type accumulation region 5 include the n-type impurity and the p-type impurity, the n-type impurity concentration C shows the net impurity concentration after the compensation of the impurities. For this reason, in FIG. 2, the n-type impurity concentration in the p-type pillar region 3 is shown by 0. As shown in FIG. 2, the n-type impurity concentration in the $n^-$-type accumulation region 5 is lower than the n-type impurity concentration in the $n^+$-type buffer region 4, and is lower than the n-type impurity concentration in the $n^{++}$-type drain region 1. The impurity profile includes a minimal point M between the $n^{++}$-type drain region 1 and the p-type pillar region 3.

Operations of the semiconductor device 100 will now be described.

A voltage that is a threshold or more is applied to the gate electrode 10 in a state in which a positive voltage with respect to the source electrode 22 is applied to the drain electrode 21. Thereby, a channel (an inversion layer) is formed in a region of the $p^+$-type base region 6 at the gate insulating layer 11 vicinity; and the semiconductor device 100 is set to the ON-state. Electrons flow through the channel and the n-type pillar region 2 from the source electrode 22 to the drain electrode 21. Subsequently, when the voltage applied to the gate electrode 10 becomes lower than the threshold, the channel of the p$^+$-type base region 6 disappears; and the semiconductor device 100 is set to the OFF-state.

Hereinbelow, the "application to the drain electrode 21 of a positive voltage with respect to the source electrode 22" is called simply the "application of a positive voltage to the drain electrode 21." The "application to the source electrode 22 of a positive voltage with respect to the drain electrode 21" is called the "application of a positive voltage to the source electrode 22."

When the semiconductor device 100 is switched from the ON-state to the OFF-state in the state in which the positive voltage is applied to the drain electrode 21, a depletion layer spreads in the vertical direction from the p-n junction surface between the n-type pillar region 2 and the p-type pillar region 3. The breakdown voltage of the semiconductor device 100 can be increased by the spreading of the depletion layer. Or, the n-type impurity concentration of the n-type pillar region 2 can be increased; and the ON-resistance of the semiconductor device 100 can be reduced while maintaining the breakdown voltage of the semiconductor device 100.

The semiconductor device 100 includes a diode including the p-type semiconductor regions of the p-type pillar region 3, the p$^+$-type base region 6, etc., and the n-type semiconductor regions of the n-type pillar region 2, the n$^+$-type buffer region 4, etc. When a positive voltage is applied to the source electrode 22, a current flows in the forward direction of the diode. Subsequently, when a positive voltage is applied to the drain electrode 21, the carriers that are accumulated in the semiconductor device 100 interior are ejected through the drain electrode 21 and the source electrode 22. At this time, a recovery current flows in the semiconductor device 100 from the drain electrode 21 toward the source electrode 22.

Examples of the materials of the components will now be described.

The n$^{++}$-type drain region 1, the n-type pillar region 2, the p-type pillar region 3, the n$^+$-type buffer region 4, the n$^-$-type accumulation region 5, the p$^+$-type base region 6, and the n$^{++}$-type source regions 7 include silicon, silicon carbide, gallium nitride, or gallium arsenide as a semiconductor material. In the case where silicon is used as the semiconductor material, arsenic, phosphorus, or antimony can be used as an n-type impurity. Boron can be used as a p-type impurity.

The gate electrode 10 includes a conductive material such as polysilicon, etc. An impurity may be added to the conductive material.

The gate insulating layer 11 includes an insulating material such as silicon oxide, etc.

The drain electrode 21 and the source electrode 22 include a metal such as aluminum, etc.

An example of a method for manufacturing the semiconductor device according to the first embodiment will now be described with reference to FIGS. 3A and 3B.

Figure 3A:
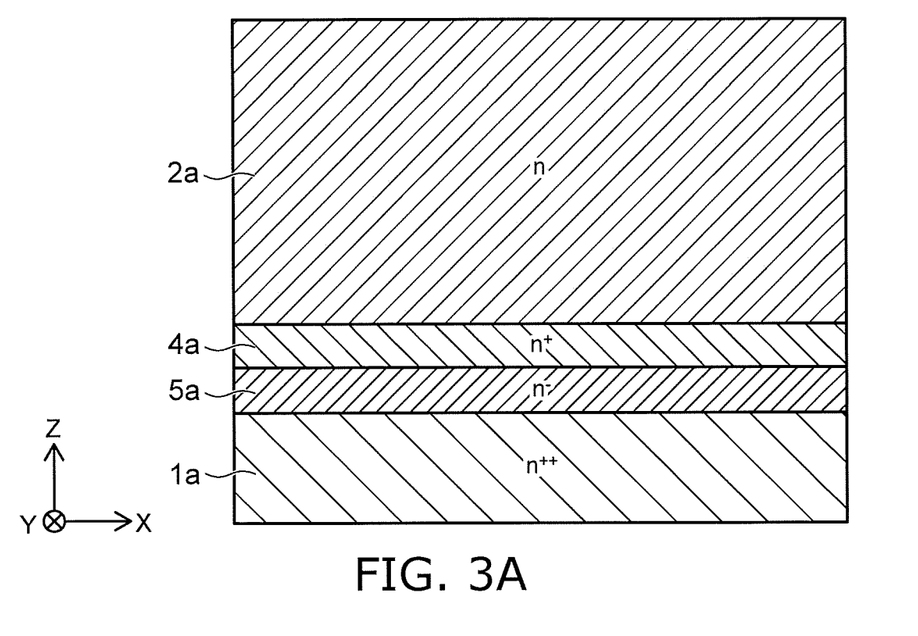
FIGS. 3A and 3B are process cross-sectional views illustrating manufacturing processes of the semiconductor device according to the first embodiment.
Figure 3B:
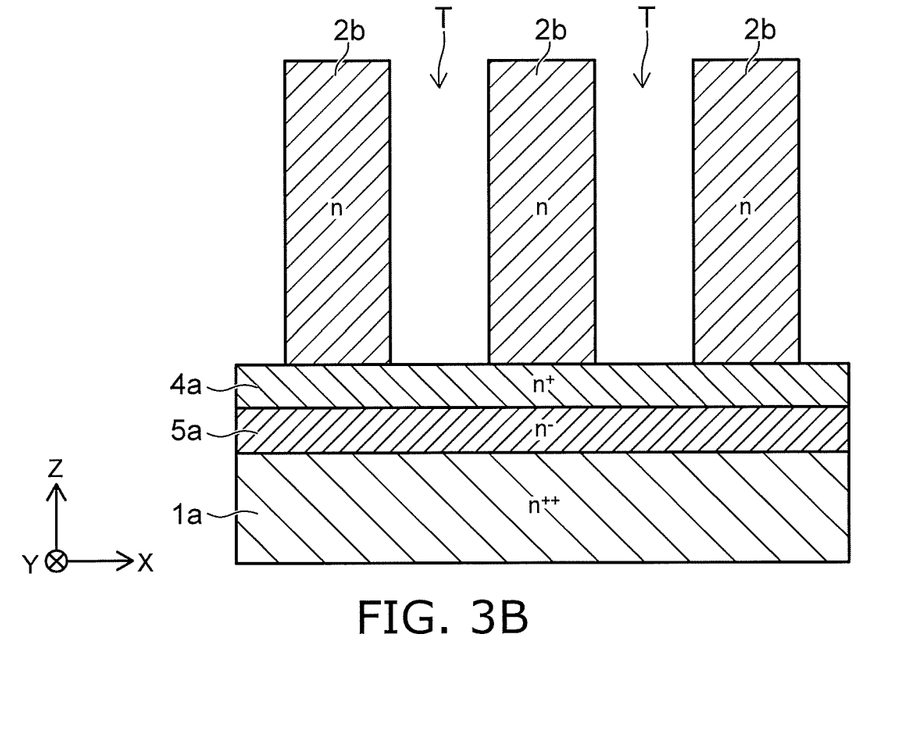

FIGS. 3A and 3B are process cross-sectional views illustrating manufacturing processes of the semiconductor device according to the first embodiment.

First, an n$^{++}$-type semiconductor substrate 1a is prepared. As illustrated in FIG. 3A, an n$^-$-type semiconductor layer 5a, an n$^+$-type semiconductor layer 4a, and an n-type semiconductor layer 2a are epitaxially grown sequentially on the semiconductor substrate 1a.

As illustrated in FIG. 3B, multiple trenches T that extend in the Y-direction are formed in the epitaxially-grown semiconductor layers. The trenches T extend through the n-type semiconductor layer 2a. For example, multiple n-type semiconductor layers 2b are formed. n-type semiconductor layers 2b are arranged in the X-direction. The trenches T reach the n$^+$-type semiconductor layer 4a. For example, the trenches T are formed by removing a portion of the n-type semiconductor layer 2a by RIE (Reactive Ion Etching).

Figure 4A:
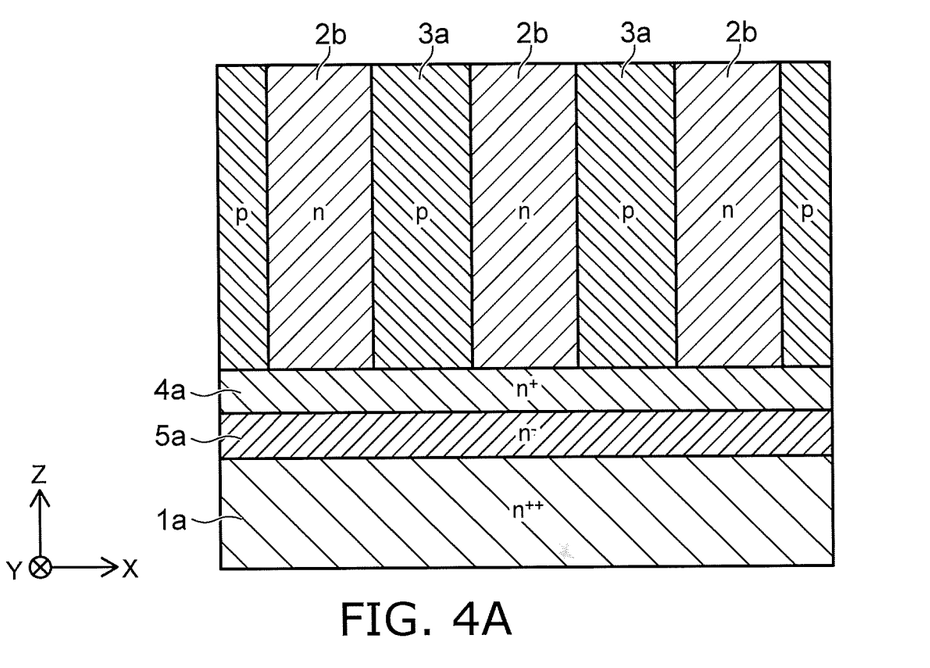
FIGS. 4A and 4B are process cross-sectional views illustrating manufacturing processes of the semiconductor device according to the first embodiment.

A p-type semiconductor layer that fills the multiple trenches T is epitaxially grown. The upper surface of the p-type semiconductor layer is planarized by polishing; and the position of the upper surface is caused to recede. As illustrated in FIG. 4A, p-type semiconductor layers 3a are formed between the n-type semiconductor layers 2b. An insulating layer 11a is formed on the upper surfaces of the n-type semiconductor layers 2b and the p-type semiconductor layers 3a by thermal oxidation.

Figure 4B:
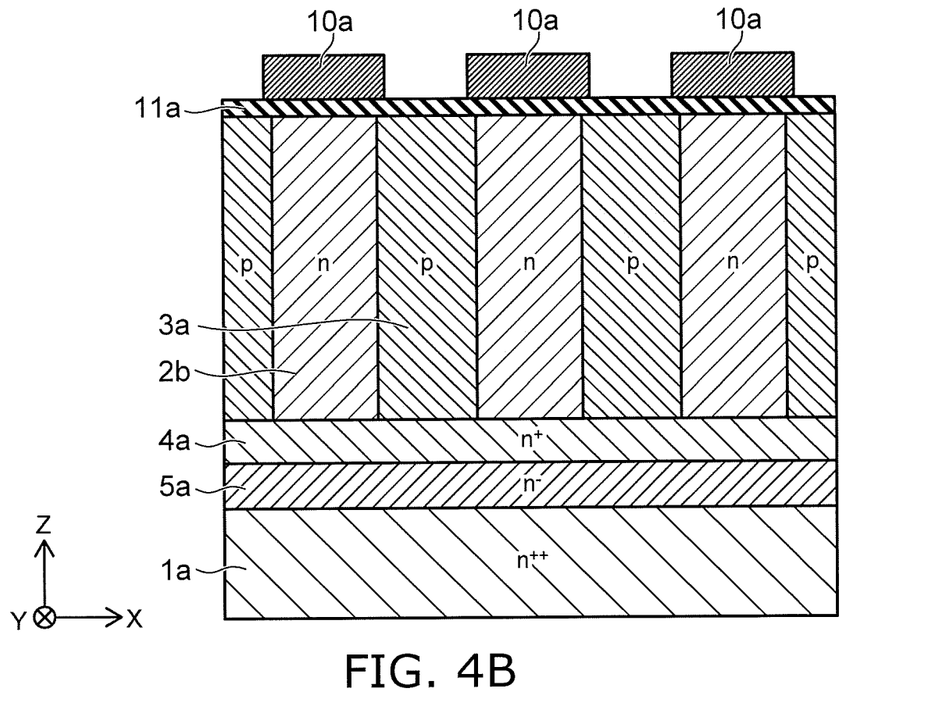

A conductive layer is formed on the insulating layer 11a by depositing a conductive material (polysilicon) by CVD (Chemical Vapor Deposition). The conductive layer is patterned. As illustrated in FIG. 4B, multiple conductive layers 10a are formed to be positioned respectively on the multiple n-type semiconductor layers 2b.

Figure 5A:
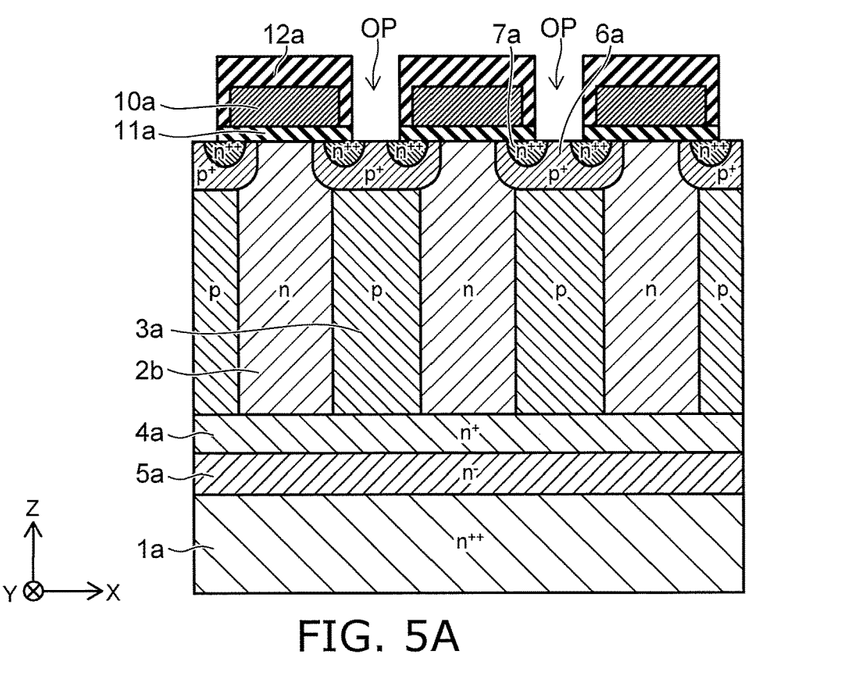
FIGS. 5A and 5B are process cross-sectional views illustrating manufacturing processes of the semiconductor device according to the first embodiment.

An insulating layer 12a that covers the multiple conductive layers 10a is formed by CVD. Openings OP that pierce the insulating layer 11a and the insulating layer 12a are formed between the conductive layers 10a by RIE. A p-type impurity is ion-implanted into the upper surfaces of the p-type semiconductor layers 3a via the openings OP; continuing, an n-type impurity is sequentially ion-implanted selectively. As illustrated in FIG. 5A, p$^+$-type semiconductor regions 6a and n$^{++}$-type semiconductor regions 7a are formed.

Figure 5B:
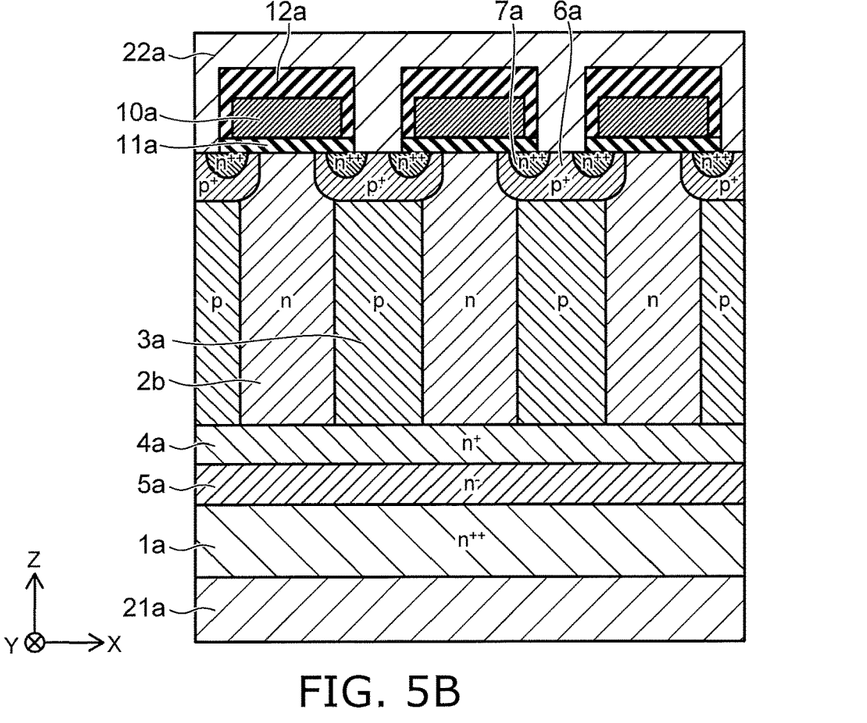

A metal layer 22a that contacts the p$^+$-type semiconductor regions 6a and the n$^{++}$-type semiconductor regions 7a and covers the insulating layer 12a is formed by sputtering. The lower surface of the semiconductor substrate 1a is polished until the semiconductor substrate 1a has a prescribed thickness. As illustrated in FIG. 5B, a metal layer 21a is formed on the polished lower surface of the semiconductor substrate 1a by sputtering. By the processes recited above, the semiconductor device 100 illustrated in FIG. 1 is manufactured.

Effects of the first embodiment will now be described.

As described above, a positive voltage is applied to the source electrode 22; subsequently, when a positive voltage is applied to the drain electrode 21, a recovery current flows in the semiconductor device 100. At this time, when the magnitude (the current value) of the recovery current changes abruptly, the voltage of the drain electrode 21 oscillates; and noise is generated. When the noise is large, the noise may cause misoperation and/or malfunction of other electronic components included in the circuit including the semiconductor device 100. Therefore, it is desirable for the noise to be small.

To reduce the fluctuation of the current value when the positive voltage is applied to the drain electrode 21, it is desirable for the carriers accumulated in the interior of the semiconductor device 100 to be ejected over a longer time. The time until the accumulated carriers are ejected has a relationship with the spreading of the depletion layer when the positive voltage is applied to the drain electrode 21. If the depletion layer spreads more distally in a shorter time, more carriers are ejected in a short length of time; and the fluctuation of the current value increases.

In the first embodiment, the n$^+$-type buffer region 4 is provided in the semiconductor device 100 to suppress the spreading of the depletion layer. The n-type impurity concentration of the $n^+$-type buffer region 4 is higher than the n-type impurity concentration of the n-type pillar region 2. Thereby, the depletion layer does not spread easily toward the $n^+$-type buffer region 4 from the interface between the p-type pillar region 3 and the $n^+$-type buffer region 4. The n-type impurity concentration of the $n^+$-type buffer region 4 is set so that the spreading of the depletion layer in the normal use mode of the semiconductor device 100 stops at the $n^+$-type buffer region 4, and so that the $n^+$-type buffer region 4 is not depleted completely. Because the spreading of the depletion layer in the $n^+$-type buffer region 4 is suppressed, the carriers (the holes) that are accumulated in the $n^+$-type buffer region 4 and the $n^-$-type accumulation region 5 are ejected over a longer time.

In the semiconductor device 100, the $n^-$-type accumulation region 5 is provided between the $n^{++}$-type drain region 1 and the $n^+$-type buffer region 4. The n-type impurity concentration of the $n^-$-type accumulation region 5 is lower than the n-type impurity concentration of the $n^+$-type buffer region 4. Therefore, more holes are accumulated in the $n^-$-type accumulation region 5 than in the $n^+$-type buffer region 4. Further, the spreading of the depletion layer into the $n^-$-type accumulation region 5 is suppressed by the $n^+$-type buffer region 4. Because the spreading of the depletion layer is suppressed by the $n^+$-type buffer region 4, the carriers that are accumulated in the $n^-$-type accumulation region 5 are ejected over a longer time compared to the case where the $n^+$-type buffer region 4 is not provided.

According to the first embodiment, by providing the $n^+$-type buffer region 4 and the $n^-$-type accumulation region 5, the carriers that are accumulated in the semiconductor device 100 can be ejected over a longer time. Thereby, the change of the magnitude of the recovery current over time can be small; and the noise that is generated by the semiconductor device 100 can be small.

Figure 6:
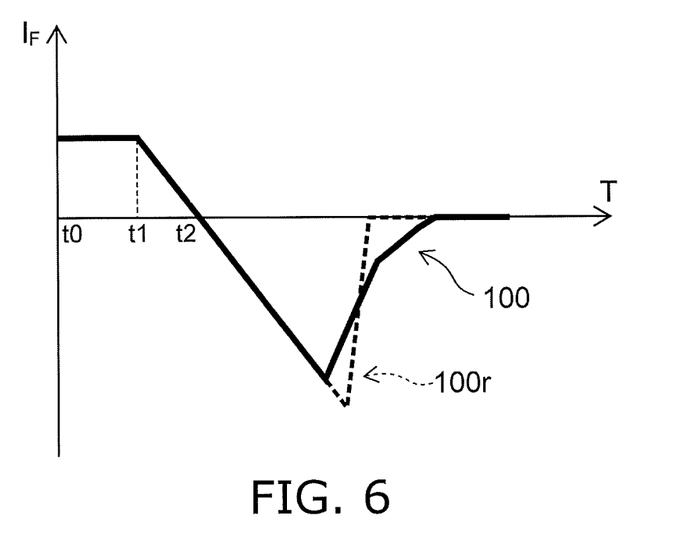
FIG. 6 is a graph illustrating characteristics of semiconductor devices according to a reference example and the first embodiment.

FIG. 6 is a graph illustrating characteristics of semiconductor devices according to a reference example and the first embodiment.

In FIG. 6, the horizontal axis is a time T; and the vertical axis is the magnitude (the current value) of a current $I_F$. The broken line illustrates the characteristic of a semiconductor device 100r according to the reference example; and the solid line illustrates the characteristic of the semiconductor device 100 according to the first embodiment. In the semiconductor device 100r according to the reference example, an n-type semiconductor region that has the same concentration as the n-type pillar region 2 is provided instead of the $n^+$-type buffer region 4 and the $n^-$-type accumulation region 5. Otherwise, the structure of the semiconductor device 100r according to the reference example is the same as that of the semiconductor device 100.

From time t0 to t1, a current flows in the forward direction of the diode of the semiconductor device 100. After time t1, the positive voltage that is applied to the drain electrode 21 increases. The current value decreases after time t1. The current stops flowing in the forward direction at time t2. The carriers that are accumulated in the interior of the semiconductor device 100 start to be ejected at time t2. Thereby, a current (a recovery current) flows in the reverse direction of the forward direction.

From time t2 onward, the magnitude of the current value peaks and subsequently decreases toward 0. Here, the oscillation (the noise) of the voltage of the drain electrode 21 is larger when the change of the current value over time is larger.

According to the first embodiment as described above, the carriers are ejected over a longer time. As illustrated in FIG. 6, compared to the semiconductor device 100r according to the reference example, the current value decreases more gradually after peaking. According to the first embodiment, the noise that is generated can be small compared to that of the semiconductor device 100r according to the reference example.

In the example illustrated in FIG. 6, the peak of the current value of the semiconductor device 100 is smaller than the peak of the current value of the semiconductor device 100r. This is due to the following reasons. In the semiconductor device 100r, the $n^+$-type buffer region 4 does not exist. Therefore, when applying the positive voltage to the drain electrode 21 in the normal use mode of the semiconductor device, the width of the depletion layer spreading from the p-type pillar region 3 toward the $n^{++}$-type drain region 1 is wide (thick). Thereby, the ejected carrier amount increases; and the peak is larger.

Desirable configurations of the semiconductor device 100 will now be described.

The n-type impurity concentration of the $n^-$-type accumulation region 5 may be the same as the n-type impurity concentration of the n-type pillar region 2; but it is desirable for the n-type impurity concentration of the $n^-$-type accumulation region 5 to be lower than the n-type impurity concentration of the n-type pillar region 2. More carriers can be accumulated in the $n^-$-type accumulation region 5 to which the depletion layer does not spread easily; and the change of the current value can be reduced further.

The desirable impurity concentrations of the n-type pillar region 2, the p-type pillar region 3, the $n^+$-type buffer region 4, and the $n^-$-type accumulation region 5 are as follows. In the case where these semiconductor regions include an n-type impurity and a p-type impurity, it is desirable for the net impurity concentration after the impurities compensate each other to be within the following ranges.

The n-type impurity concentration of the n-type pillar region 2 is not less than $1.0 \times 10^{15}$ atoms/cm$^3$ and not more than $1.0 \times 10^{16}$ atoms/cm$^3$.

The p-type impurity concentration of the p-type pillar region 3 is not less than $1.0 \times 10^{15}$ atoms/cm$^3$ and not more than $1.0 \times 10^{16}$ atoms/cm$^3$.

The n-type impurity concentration of the $n^+$-type buffer region 4 is not less than $2.0 \times 10^{15}$ atoms/cm$^3$ and not more than $2.0 \times 10^{16}$ atoms/cm$^3$.

The n-type impurity concentration of the $n^-$-type accumulation region 5 is not less than $5.0 \times 10^{14}$ atoms/cm$^3$ and not more than $5.0 \times 10^{15}$ atoms/cm$^3$.

The n-type impurity concentration at the minimal point M shown in FIG. 2 is, for example, not less than $5.0 \times 10^{14}$ atoms/cm$^3$ and not more than $5.0 \times 10^{15}$ atoms/cm$^3$.

It is desirable for the thickness in the Z-direction of the $n^-$-type accumulation region 5 to be thinner than the thickness in the Z-direction of the $n^+$-type buffer region 4. This is because the ON-resistance of the semiconductor device 100 can be reduced when the thickness of the n-type semiconductor region having the low concentration is smaller.

A heavy metal may be added to at least a portion of the n-type pillar region 2 and at least a portion of the p-type pillar region 3. Or, crystal defects may be formed by irradiating charged particles on at least a portion of the n-type pillar region 2 and at least a portion of the p-type pillar region 3 when forming the n-type pillar region 2 and the p-type pillar region 3. Thereby, the time (the carrier lifetime) until the carriers disappear in the n-type pillar region 2 and the p-type pillar region 3 can be short. By shortening the carrier lifetime in these regions, the accumulation amount of the carriers can be reduced in the easily-depleted regions. Thereby, the change of the magnitude of the recovery current can be reduced; and the noise that is generated by the semiconductor device 100 can be reduced further. The addition of the heavy metal or the irradiation of the charged particles may be performed for the $n^+$-type buffer region 4 and/or the $n^-$-type accumulation region 5 in addition to the at least a portion of the n-type pillar region 2 and the at least a portion of the p-type pillar region 3.

Second Embodiment

Figure 7:
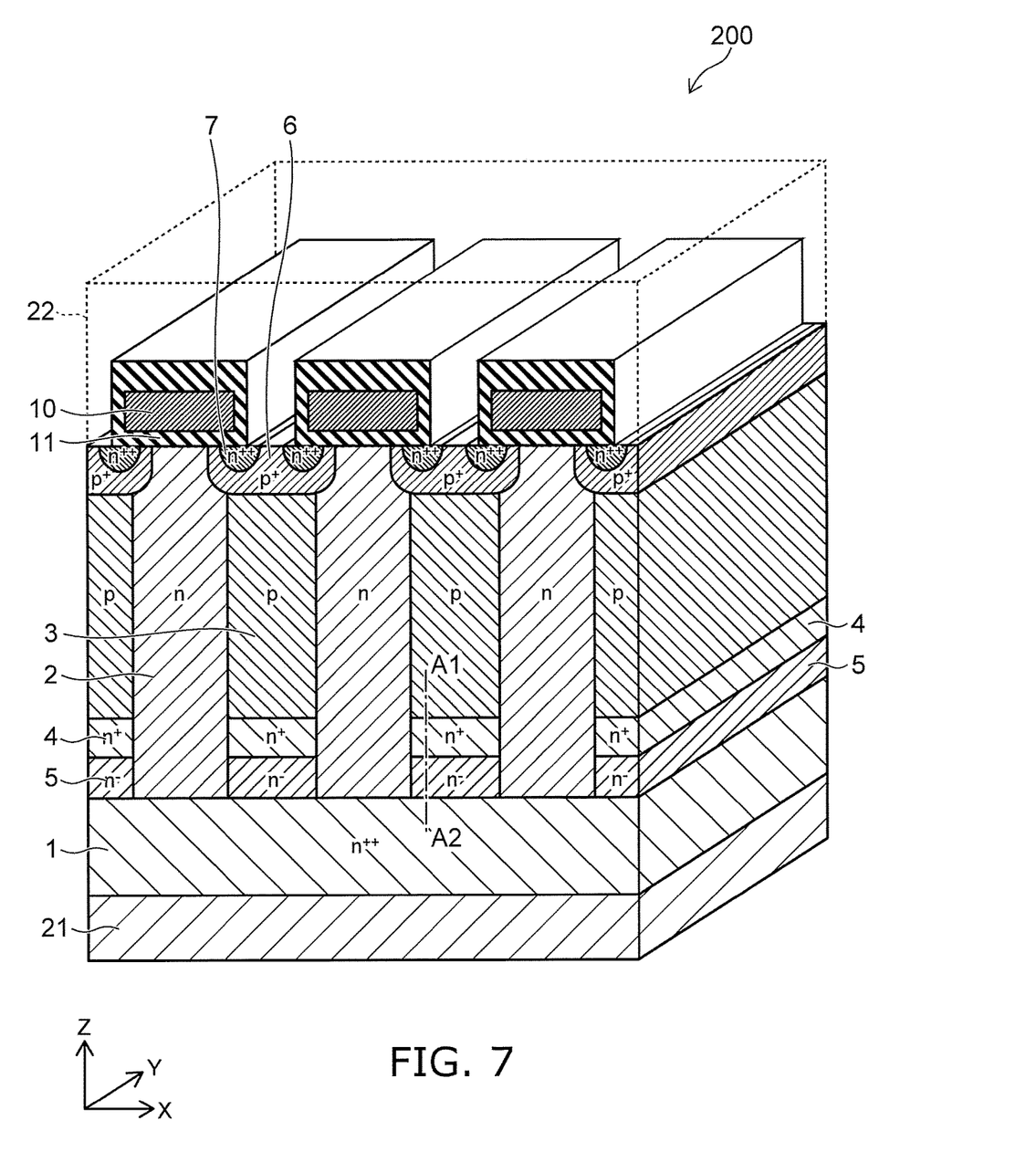
FIG. 7 is a perspective cross-sectional view illustrating a semiconductor device according to a second embodiment.

FIG. 7 is a perspective cross-sectional view illustrating a semiconductor device according to a second embodiment.

The semiconductor device 200 according to the second embodiment illustrated in FIG. 7 differs from the semiconductor device 100 in that the $n^+$-type buffer region 4 and the $n^-$-type accumulation region 5 are not provided between the $n^{++}$-type drain region 1 and the n-type pillar region 2. In the semiconductor device 200, the $n^+$-type buffer region 4 and the $n^-$-type accumulation region 5 are provided only between the $n^{++}$-type drain region 1 and the p-type pillar region 3. The p-type pillar region 3, the $n^+$-type buffer region 4, and the $n^-$-type accumulation region 5 are arranged with the n-type pillar region 2 in the X-direction.

By providing the $n^+$-type buffer region 4 and the rt-type accumulation region 5 between the $n^{++}$-type drain region 1 and the p-type pillar region 3, the spreading of the depletion layer can be suppressed; and more carriers can be accumulated in regions where the depletion layer does not spread easily. According to the second embodiment as well, similarly to the first embodiment, the noise that is generated by the semiconductor device 200 can be reduced.

The profile of the n-type impurity concentration in A1-A2 line shown in FIG. 7 is, for example, includes a minimal point between the $n^{++}$-type drain region 1 and the p-type pillar region 3 as well as FIG. 2.

Figure 8A:
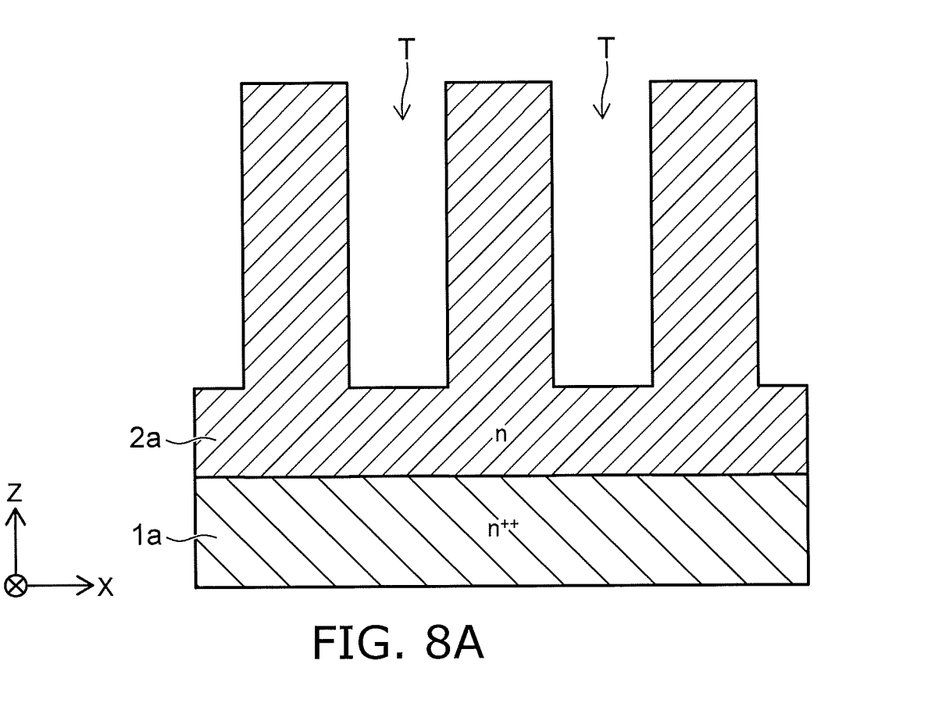
FIGS. 8A and 8B are process cross-sectional views illustrating manufacturing processes of the semiconductor device according to the second embodiment.
Figure 8B:
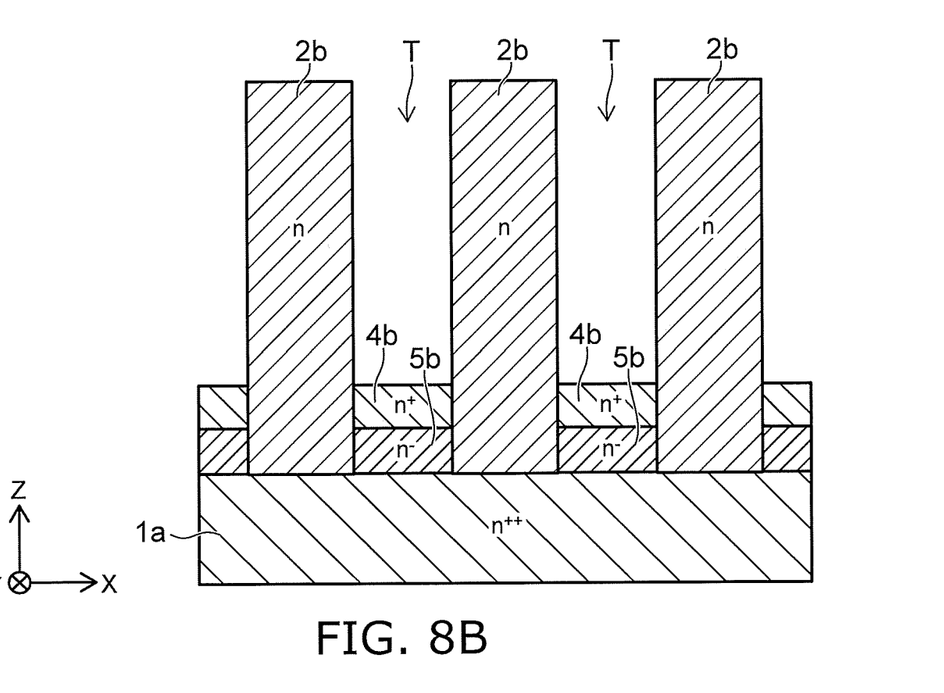

FIGS. 8A and 8B are process cross-sectional views illustrating manufacturing processes of the semiconductor device according to the second embodiment.

The $n^{++}$-type semiconductor substrate 1a is prepared; and the n-type semiconductor layer 2a is epitaxially grown on the semiconductor substrate 1a. As illustrated in FIG. 8A, the trenches T that extend in the Y-direction are multiply formed in the n-type semiconductor layer 2a. The trenches T are formed so that a portion of the n-type semiconductor layer 2a remains at the bottom portions of the trenches T.

A small amount of a p-type impurity is ion-implanted into the bottom portions of the trenches T. At the bottom portions of the trenches T, the n-type impurity and the p-type impurity inside the n-type semiconductor layer 2a compensate each other; and $n^-$-type semiconductor regions 5b are formed. The n-type impurity is ion-implanted into the surfaces of the $n^-$-type semiconductor regions 5b via the trenches T. As illustrated in FIG. 8B, $n^+$-type semiconductor regions 4b are formed. The $n^+$-type semiconductor regions 4b and the $n^-$-type semiconductor regions 5b are multiply formed in the X-direction. The n-type semiconductor layer 2a is divided into a plurality by the multiple $n^+$-type semiconductor regions 4b and the multiple $n^-$-type semiconductor regions 5b; and the multiple n-type semiconductor layers 2b are formed.

The p-type semiconductor layers 3a are formed between the n-type semiconductor layers 2b by performing a process similar to the process illustrated in FIG. 4A. Subsequently, the semiconductor device 200 is manufactured by performing processes similar to the processes illustrated in FIG. 4B to FIG. 5B.

Third Embodiment

Figure 9:
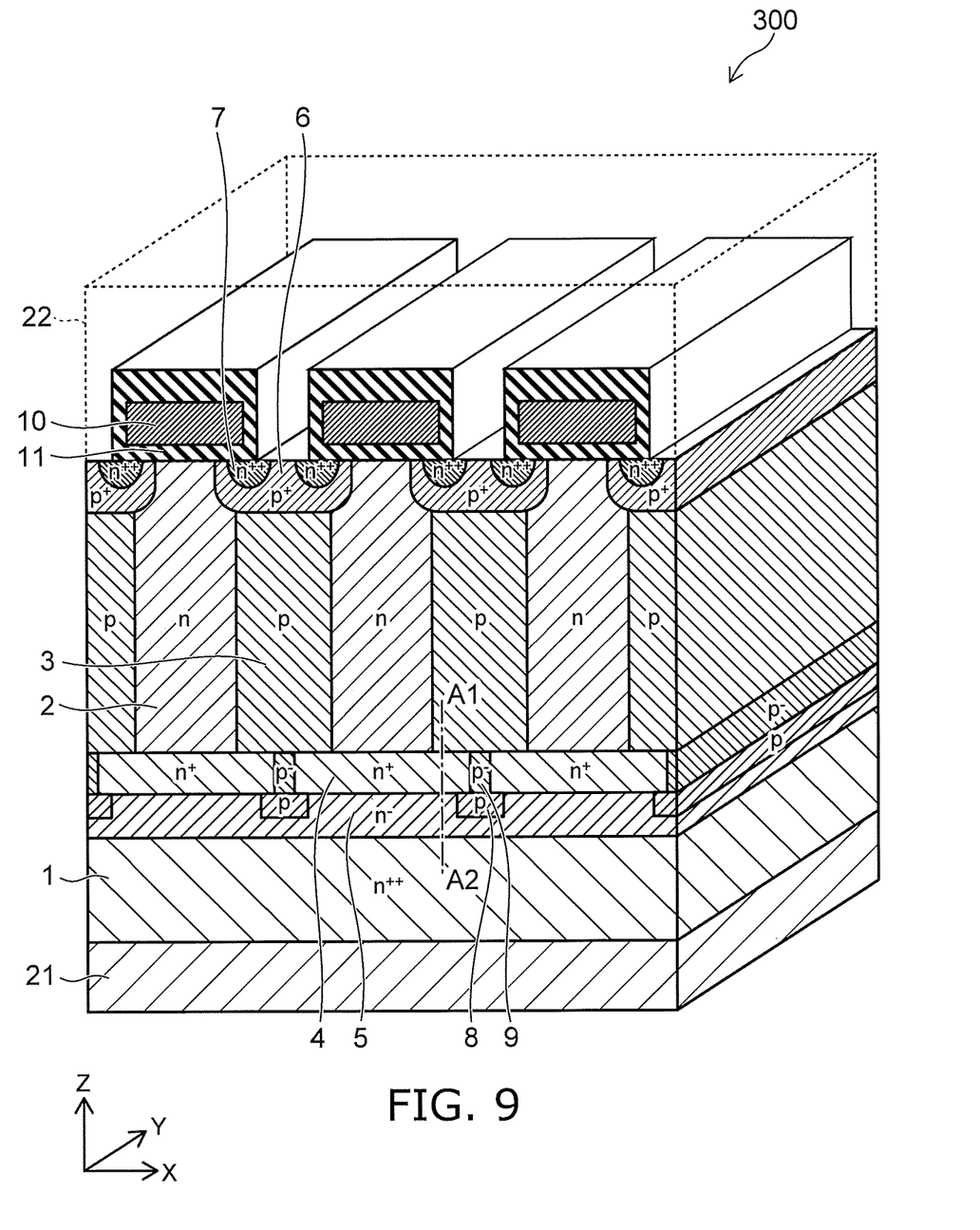
FIG. 9 is a perspective cross-sectional view illustrating a semiconductor device according to a third embodiment.

FIG. 9 is a perspective cross-sectional view illustrating a semiconductor device according to a third embodiment.

Compared to the semiconductor device 100, the semiconductor device 300 illustrated in FIG. 9 further includes a p-type semiconductor region 8 (eighth semiconductor region) and a $p^-$-type semiconductor region 9 (ninth semiconductor region).

The p-type semiconductor region 8 is provided inside the $n^-$-type accumulation region 5 and is positioned between the $n^{++}$-type drain region 1 and the p-type pillar region 3. The $p^-$-type semiconductor region 9 is provided between the p-type pillar region 3 and the p-type semiconductor region 8 and is connected to the p-type semiconductor region 8 and the p-type pillar region 3. The $p^-$-type semiconductor region 9 is arranged in the X-direction with the $n^+$-type buffer region 4. A portion of the $n^+$-type buffer region 4 is provided in addition to the $p^-$-type semiconductor region 9 between the $n^{++}$-type drain region 1 and the p-type pillar region 3.

The p-type impurity concentration of the p-type semiconductor region 8 is lower than the n-type impurity concentration of the $n^+$-type buffer region 4. The p-type impurity concentration of the $p^-$-type semiconductor region 9 is lower than the p-type impurity concentration of the p-type semiconductor region 8.

The profile of the n-type impurity concentration in A1-A2 line shown in FIG. 9 includes a minimal point between the $n^{++}$-type drain region 1 and the p-type pillar region 3 as well as FIG. 2.

When the positive voltage is applied to the drain electrode 21 in the semiconductor device 300, a depletion layer spreads in the X-direction from the interface between the $n^+$-type buffer region 4 and the $p^-$-type semiconductor region 9; and the $p^-$-type semiconductor region 9 is depleted thereby. The spreading of the depletion layer in the Z-direction from the interface between the p-type pillar region 3 and the $n^{-'}$-type buffer region 4 is suppressed by the $n^+$-type buffer region 4. In other words, according to the third embodiment as well, similarly to the first embodiment, the noise that is generated by the semiconductor device 300 can be reduced.

Thus, a p-type semiconductor region may be provided partially between the n'-type drain region 1 and the p-type pillar region 3 as long as the semiconductor region is depleted when the positive voltage is applied to the drain electrode 21.

According to the third embodiment, more carriers can be accumulated in the $n^-$-type accumulation region 5 when a positive voltage is applied to the source electrode 22 because the p-type semiconductor region 8 is disposed to protrude into the $n^-$-type accumulation region 5. More carriers can be accumulated even without reducing the n-type impurity concentration of the $n^-$-type accumulation region 5. As a result, the noise can be reduced further while suppressing the increase of the ON-resistance of the semiconductor device 300.

FIG. 10A to FIG. 11B are process cross-sectional views illustrating manufacturing processes of the semiconductor device according to the third embodiment.

Figure 10A:
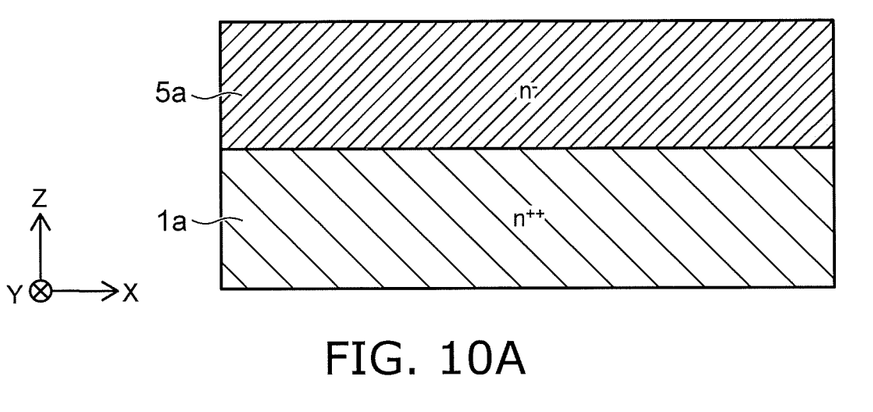
FIG. 10A to FIG. 10B are process cross-sectional views illustrating manufacturing processes of the semiconductor device according to the third embodiment.
Figure 10B:
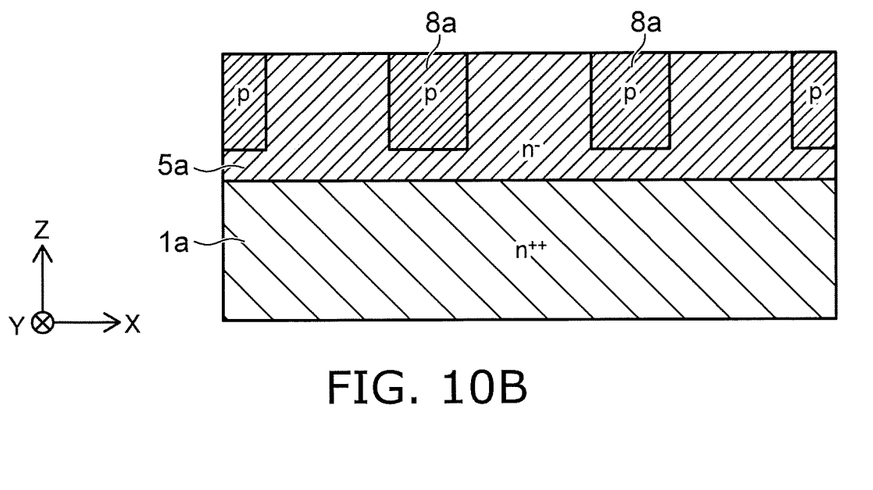

The $n^{++}$-type semiconductor substrate 1a is prepared. As illustrated in FIG. 10A, the $n^-$-type semiconductor layer 5a is epitaxially grown on the semiconductor substrate 1a. A p-type impurity is ion-implanted selectively into the upper surface of the n⁻-type semiconductor layer 5a; and multiple p-type semiconductor regions 8a are formed as illustrated in FIG. 10B.

Figure 11A:
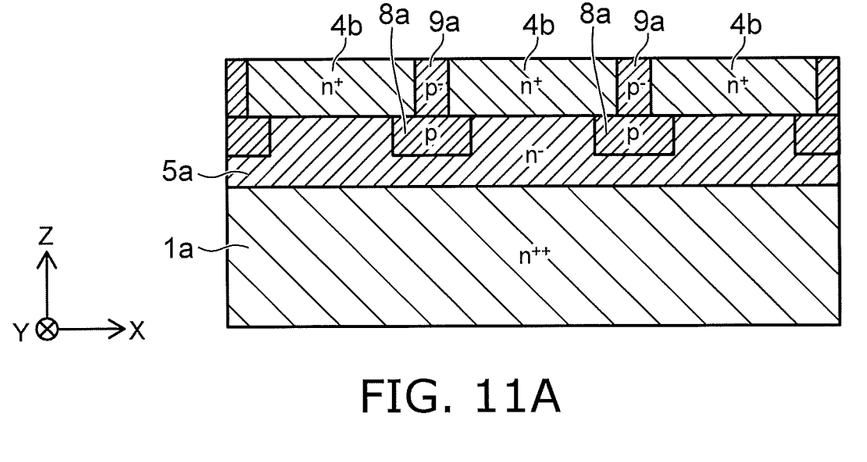
FIG. 11A to FIG. 11B are process cross-sectional views illustrating manufacturing processes of the semiconductor device according to the third embodiment.

A mask is provided on at least a portion of the p-type semiconductor regions 8a. An n-type impurity is ion-implanted between the upper portions of the p-type semiconductor regions 8a. The mask is removed. The multiple n⁺-type semiconductor regions 4b are formed as illustrated in FIG. 11A. At this time, the n-type impurity diffuses toward the upper portions of the p-type semiconductor regions 8a from the ion-implanted regions between the upper portions of the p-type semiconductor regions 8a. The effective p-type impurity concentration of the upper portions of the p-type semiconductor regions 8a decreases; and p⁻-type semiconductor regions 9a are formed. The n-type impurity concentration of the n⁺-type semiconductor regions 4b is higher than the p-type impurity concentration of the remaining p-type semiconductor regions 8a. The lengths in the X-direction of the p⁻-type semiconductor regions 9a are shorter than the lengths in the X-direction of the p-type semiconductor regions 8a.

Figure 11B:
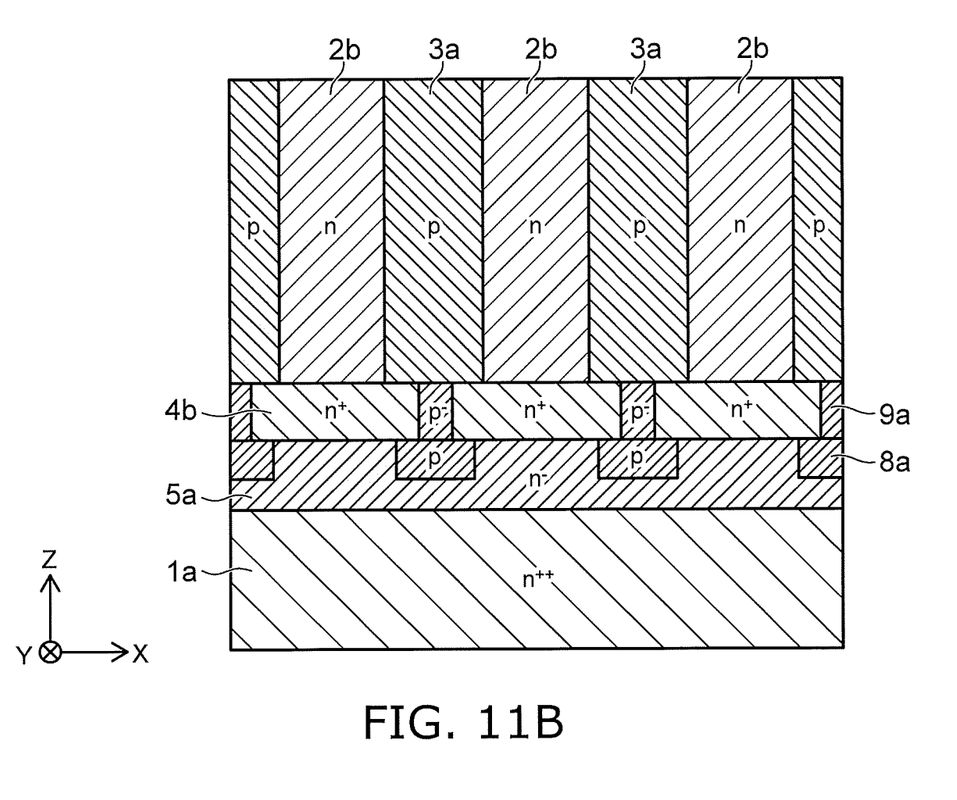

An n-type semiconductor layer is epitaxially grown on the n⁺-type semiconductor regions 4b and the p⁻-type semiconductor regions 9a. Multiple trenches extend through the n-type semiconductor layer. For example, multiple n-type semiconductor layers 2b are formed. The p-type semiconductor layers 3a are formed as illustrated in FIG. 11B by performing a process similar to the process illustrated in FIG. 4A. Subsequently, the semiconductor device 300 is manufactured by performing processes similar to the processes illustrated in FIG. 4B to FIG. 5B.

In the example illustrated in FIG. 9, the n⁺-type buffer region 4 is provided between the n⁺⁺-type drain region 1 and the n-type pillar region 2 and between the n⁺⁺-type drain region 1 and a portion of the p-type pillar region 3. This is not limited to the example; and the n⁺-type buffer region 4 may be provided only between the n⁺⁺-type drain region 1 and the portion of the p-type pillar region 3. In other words, as in the semiconductor device 200 according to the second embodiment, the p-type pillar region 3, the n⁺-type buffer region 4, and the n⁻-type accumulation region 5 may be arranged with the n-type pillar region 2 in the X-direction; and the p⁻-type semiconductor region 9 and the p-type semiconductor region 8 may be provided inside the n⁺-type buffer region 4 and inside the n⁻-type accumulation region 5.

It is possible to confirm the relative levels of the impurity concentrations of the semiconductor regions in the embodiments described above, for example, using a SCM (scanning capacitance microscope) or SSRM (scanning spread resistance microscopy). The relative levels of the impurity concentrations of the semiconductor regions after the compensation can be confirmed by using SCM or SSRM. The carrier concentrations of the semiconductor regions may be considered to be equal to the activated impurity concentrations of the semiconductor regions. Accordingly, the relative levels of the carrier concentrations of the semiconductor regions can be confirmed using SCM. It is possible to measure the impurity concentrations of the semiconductor regions, for example, using a SIMS (secondary ion mass spectrometer).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. The embodiments described above can be practiced by combining one another.

What is claimed is:

1. A semiconductor device, comprising:
   a first electrode;
   a first semiconductor region provided on the first electrode, the first semiconductor region being of a first conductivity type and being electrically connected to the first electrode;
   a second semiconductor region provided on a portion of the first semiconductor region, the second semiconductor region being of the first conductivity type, an impurity concentration of the first conductivity type in the second semiconductor region being lower than an impurity concentration of the first conductivity type in the first semiconductor region;
   a third semiconductor region provided on another portion of the first semiconductor region, the third semiconductor region being of a second conductivity type and being arranged with at least a portion of the second semiconductor region in a first direction perpendicular to a second direction, the second direction being from the first electrode toward the first semiconductor region;
   a fourth semiconductor region provided in at least a portion between the first semiconductor region and the third semiconductor region, the fourth semiconductor region being of the first conductivity type, an impurity concentration of the first conductivity type in the fourth semiconductor region being lower than the impurity concentration of the first conductivity type in the first semiconductor region and higher than the impurity concentration of the first conductivity type in the second semiconductor region;
   a fifth semiconductor region provided between the first semiconductor region and the fourth semiconductor region, the fifth semiconductor region being of the first conductivity type, an impurity concentration of the first conductivity type in the fifth semiconductor region being lower than the impurity concentration of the first conductivity type in the fourth semiconductor region;
   a sixth semiconductor region provided on the third semiconductor region, the sixth semiconductor region being of the second conductivity type, an impurity concentration of the second conductivity type in the sixth semiconductor region being higher than an impurity concentration of the second conductivity type in the third semiconductor region;
   a seventh semiconductor region provided selectively on the sixth semiconductor region, the seventh semiconductor region being of the first conductivity type;
   a gate electrode opposing the second semiconductor region, the sixth semiconductor region, and the seventh semiconductor region with a gate insulating layer interposed; and
   a second electrode provided on the sixth semiconductor region and the seventh semiconductor region and electrically connected to the sixth semiconductor region and the seventh semiconductor region,
   wherein the fourth semiconductor region and the fifth semiconductor region are arranged with a portion of the second semiconductor region in the first direction.

2. The device according to claim 1, wherein the impurity concentration of the first conductivity type in the fifth semiconductor region is lower than the impurity concentration of the first conductivity type in the second semiconductor region.

3. The device according to claim 1, wherein a heavy metal is added or charged particles are irradiated into at least a portion of the second semiconductor region and at least a portion of the third semiconductor region.

4. A semiconductor device, comprising:
a first electrode;
a first semiconductor region provided on the first electrode, the first semiconductor region being of a first conductivity type and being electrically connected to the first electrode;
a second semiconductor region provided on a portion of the first semiconductor region, the second semiconductor region being of the first conductivity type, an impurity concentration of the first conductivity type in the second semiconductor region being lower than an impurity concentration of the first conductivity type in the first semiconductor region;
a third semiconductor region provided on another portion of the first semiconductor region, the third semiconductor region being of a second conductivity type and being arranged with at least a portion of the second semiconductor region in a first direction perpendicular to a second direction, the second direction being from the first electrode toward the first semiconductor region;
a fourth semiconductor region provided in at least a portion between the first semiconductor region and the third semiconductor region, the fourth semiconductor region being of the first conductivity type, an impurity concentration of the first conductivity type in the fourth semiconductor region being lower than the impurity concentration of the first conductivity type in the first semiconductor region and higher than the impurity concentration of the first conductivity type in the second semiconductor region;
a fifth semiconductor region provided between the first semiconductor region and the fourth semiconductor region, the fifth semiconductor region being of the first conductivity type, an impurity concentration of the first conductivity type in the fifth semiconductor region being lower than the impurity concentration of the first conductivity type in the fourth semiconductor region;
a sixth semiconductor region provided on the third semiconductor region, the sixth semiconductor region being of the second conductivity type, an impurity concentration of the second conductivity type in the sixth semiconductor region being higher than an impurity concentration of the second conductivity type in the third semiconductor region;
a seventh semiconductor region provided selectively on the sixth semiconductor region, the seventh semiconductor region being of the first conductivity type;
a gate electrode opposing the second semiconductor region, the sixth semiconductor region, and the seventh semiconductor region with a gate insulating layer interposed; and
a second electrode provided on the sixth semiconductor region and the seventh semiconductor region and electrically connected to the sixth semiconductor region and the seventh semiconductor region,
an eighth semiconductor region provided inside the fifth semiconductor region, the eighth semiconductor region being of the second conductivity type and being positioned between the first semiconductor region and the third semiconductor region; and
a ninth semiconductor region provided between the third semiconductor region and the eighth semiconductor region, the ninth semiconductor region being of the second conductivity type and being connected to the third semiconductor region and the eighth semiconductor region,
an impurity concentration of the second conductivity type in the eighth semiconductor region being lower than the impurity concentration of the first conductivity type in the fourth semiconductor region,
an impurity concentration of the second conductivity type in the ninth semiconductor region being lower than an impurity concentration of the second conductivity type in the eighth semiconductor region.

5. The device according to claim 4, wherein a length in the first direction of the ninth semiconductor region is shorter than a length in the first direction of the eighth semiconductor region.

6. The device according to claim 4, wherein the impurity concentration of the first conductivity type in the fifth semiconductor region is lower than the impurity concentration of the first conductivity type in the second semiconductor region.

7. The device according to claim 4, wherein a heavy metal is added or charged particles are irradiated into at least a portion of the second semiconductor region and at least a portion of the third semiconductor region.

* * * * *